United States Patent [19]

Shibata et al.

[11] 4,005,321
[45] Jan. 25, 1977

[54] QUARTZ CRYSTAL VIBRATOR MOUNTING
[75] Inventors: Shin Shibata, Suwa; Kikuo Oguchi, Shimosuwa, both of Japan
[73] Assignee: Kabushiki Kaisha Suwa Seikosha, Tokyo, Japan
[22] Filed: Dec. 27, 1974
[21] Appl. No.: 537,028
[30] Foreign Application Priority Data
Dec. 27, 1973 Japan .................................. 49-979
[52] U.S. Cl. .............................................. 310/9.1
[51] Int. Cl.² ........................................ H01L 41/08
[58] Field of Search ............. 310/8.2, 9.1, 9.4, 9.7, 310/9.8, 8.9; 58/237 F
[56] References Cited
UNITED STATES PATENTS

| | | | |
|---|---|---|---|
| 2,497,665 | 2/1950 | Gravley | 310/9.8 X |
| 3,187,207 | 6/1965 | Tomes | 310/8.7 |
| 3,683,213 | 8/1972 | Staudte | 310/8.2 X |
| 3,688,135 | 8/1972 | Koda et al. | 310/8.6 X |
| 3,766,616 | 10/1973 | Staudte | 310/8.2 |
| 3,805,098 | 4/1974 | Carpenter | 310/9.1 |
| 3,876,891 | 4/1975 | Schubotz | 310/9.4 |

*Primary Examiner*—Mark O. Budd
*Attorney, Agent, or Firm*—Blum, Moscovitz, Friedman & Kaplan

[57] ABSTRACT

A mounting adapted to support and provide a two-terminal connection to a flexural mode quartz crystal vibrator having two opposed surfaces with two electrodes disposed on at least one of the opposed surfaces is provided. The mounting includes a non-conductive member having first and second spaced apart conductive surfaces, the non-conductive member having a lesser thermal coefficient of expansion than the quartz crystal vibrator. At least one metallic plate is disposed between one of the conductive surfaces and the quartz crystal vibrator for coupling an electrode to a conductive surface, the metallic plate having a thermal coefficient of expansion less than the quartz crystal vibrator and the mounting member.

12 Claims, 21 Drawing Figures

QUARTZ CRYSTAL VIBRATOR MOUNTING

BACKGROUND OF THE INVENTION

This invention relates to a mounting for supporting a flexural mode quartz crystal vibrator and, in particular, to a mounting for effecting an electric coupling and physical support of a tuning fork quartz crystal vibrator to render same particularly suited for use in a small-sized electronic timepiece.

In the electronic wristwatch art, the use of quartz crystal vibrators as a high frequency time standard has gained wide acceptance. Specifically, tuning fork quartz crystal vibrators produced by photo-chemical etching have provided the necessary reduction in size to render same particularly suitable for use in electronic timepieces. Nevertheless, one such problem with quartz crystal vibrators is that the manner in which same are mounted to a case has resulted in breakage resulting from the large tensile stress between same, rendering such quartz crystal vibrator mountings less than completely satisfactory.

SUMMARY OF THE INVENTION

Generally speaking, in accordance with the invention, a mounting for supporting a tuning fork flexural mode quartz crystal vibrator is provided. The quartz crystal vibrator includes two opposed surfaces and electrodes disposed on each of said opposed surfaces. The mounting includes a non-conductive member having first and second spaced apart conductive surfaces, the non-conductive member having a lesser thermal coefficient of expansion than the quartz crystal vibrator. At least one plate is disposed between one of the conductive surfaces and the quartz crystal vibrator for electrically coupling an electrode to the conductive surface, the plate having a thermal coefficient of expansion less than the quartz crystal vibrator and mounting member.

Accordingly, it is an object of this invention to provide an improved mounting for a flexural mode quartz crystal vibrator.

Another object of this invention is to provide an improved tuning fork quartz crystal vibrator assembly for a small sized electronic wristwatch.

Still another object of this invention is to provide an improved tuning fork quartz crystal vibrator wherein stress and strain caused by differences in the thermal coefficient of expansion between the quartz crystal vibrator and a case for mounting same is substantially eliminated.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1:
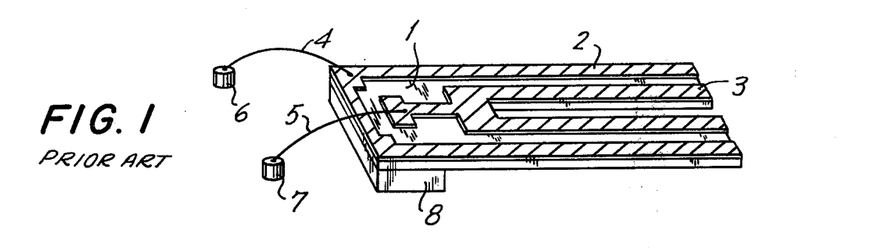
FIGS. 1 and 2 are perspective views illustrating the front and rear surfaces of a tuning fork quartz crystal vibrator constructed in accordance with the prior art.
Figure 2:
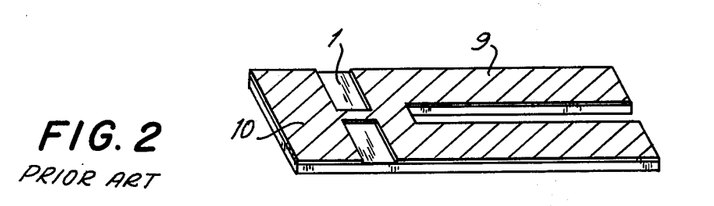
Figure 3:
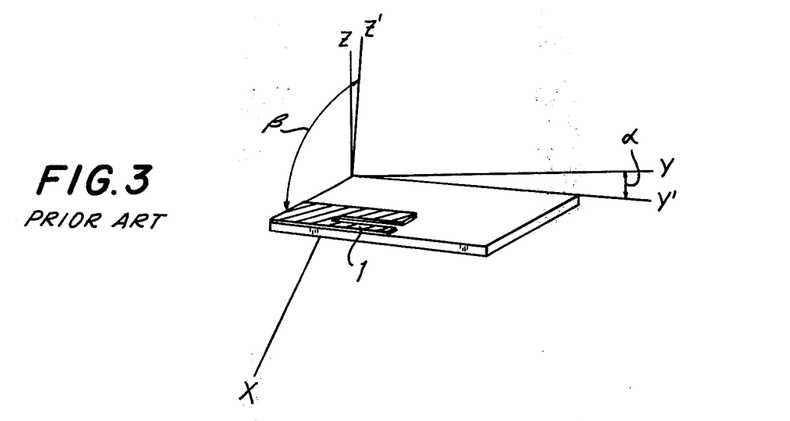
FIG. 3 is a perspective view depicting the manner in which the quartz crystal vibrator depicted in FIGS. 1 and 2 is formed.
Figure 4:
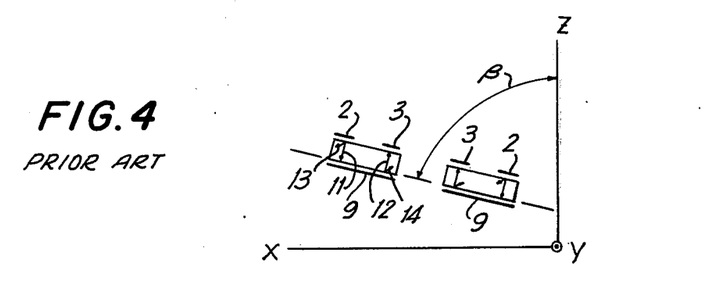
FIG. 4 is a sectional view of the quartz crystal vibrator depicted in FIG. 1 and 2 when same is in operation.

Reference is now made to FIGS. 1 and 2 depicting front and rear surfaces respectively, of an NT-cut tuning fork flexural mode quartz crystal vibrator manufactured by photo-chemical etching in a manner specifically depicted in FIG. 3. In order to simplify the drawings, the angle $\alpha$ is set for 0° about the X axis, it being noted that $\alpha$ is in the range of 0°–10°. The tuning fork flexural-mode quartz crystal vibrator depicted in FIGS. 1 and 2 includes a quartz crystal plate 1 having an electrode 3 on the inner periphery of the top surface of each of the tines and an outer peripheral electrode 2 disposed on the outer periphery of the top surface of each tine. On the bottom surface of the quartz crystal plate 1, is a single electrode 9 having a terminal portion 10 thereon. As illustrated in FIG. 3, the vibrator is formed from a quartz crystal plate which is obtained by rotating an X-cut plate around the X-axis by an angle $\alpha$ and further rotating same by an angle $\beta$ around the Y' axis, which as hereinabove noted, is found by rotating the Y axis through a rotation $\alpha$. The angle $\alpha$ is predetermined to be in the range of 0° to 10°, and the angle $\beta$ is predetermined to be 55° to 75° or −55° to −75°.

Accordingly, a tuning fork vibrator is formed by a chemical processing method whereby the electrodes are photoetched thereon, thereby resulting in a small-sized extremely thin, on the order of several tens microns, flexural mode vibrator. The electrodes 2 and 3 on the front surface are respectively coupled to terminals 6 and 7 by bonding wires 4 and 5. The electrode 9 on the bottom surface is electrically coupled through terminal portion 10 to a quartz crystal vibrator mounting member 8. Solder, conductive paste or the like is used to join electrode 9 and terminal portion 10. Accordingly, when the electrodes on the front surface and the electrode on the back surface have applied thereto positive and negative pulses, respectively, by an alternating-current signal, the electric fields generated in the tines produce transverse components 13 and 14 in the direction of the electrical axis X, causing the necessary stress to generate a symmetrical flexural vibration in the tuning fork in the manner discussed above. Nevertheless, because net transverse field components 13 and 14 are small in comparison to the field components 11 and 12 across the electrodes as $\beta$ becomes larger, the dynamic impedance increases in inverse proportion to cosine $^2\beta$ as has been determined by experimental calculations. The vibrator, to be stable at various environmental temperatures, must have a zero frequency-temperature coefficient at around room temperature. If the zero frequency-temperature coefficient is selected to be zero at 20° C, $\beta$ should be on the order of 75°. In such case, the dynamic impedance takes on magnitudes as high as several meg-ohms, which render same not practical for use as a quartz crystal vibrator.

Figure 5:
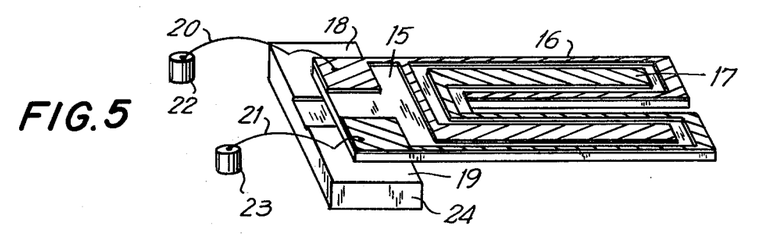
FIGS. 5 and 6 are perspective views of the top and bottom surfaces respectively of a tuning fork quartz crystal vibrator constructed in accordance with the instant invention.
Figure 6:
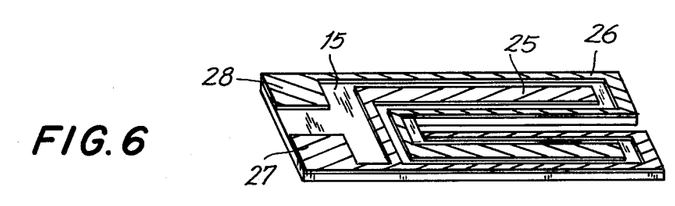
Figure 7:
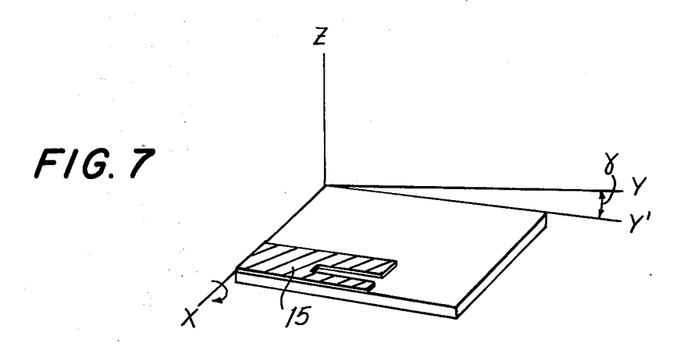
FIG. 7 is a perspective view of the manner in which the tuning fork vibrator depicted in FIGS. 5 and 6 is formed.
Figure 8:
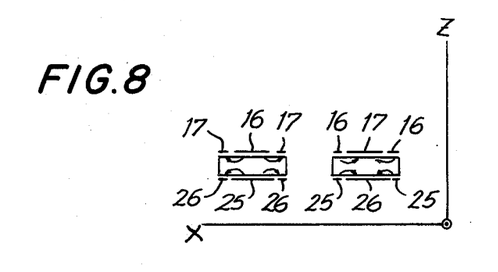
FIG. 8 is a sectional view of the quartz crystal vibrator depicted in FIGS. 1 and 2 when same is in operation.

Reference is now made to FIGS. 5 and 6 wherein the front and rear sides respectively of a thin quartz crystal vibrator formed in accordance with the instant invention, and to FIG. 7 wherein the manner in which same is formed and FIG. 8 wherein the electrode configuration thereof is illustrated in cross-section, is depicted. As is illustrated in FIG. 7, the angle $\alpha$ is set at 0° in order to simplify the illustration. Accordingly, quartz crystal plate 15 has electrodes 16 and 17 disposed on the front surface. The plate is formed by rotating the X-cut plate around the X-axis by an angle $\gamma$. The angle $\gamma$ is predetermined to equal 0° to 10°.

Electrodes 16 and 17 are disposed on the front surface of the vibrator 15 and are provided in a particular configuration so that electrode 16 is peripherally disposed around a first tine and extends onto the other tine intermediate the other electrode 17, which electrode 17 is peripherally disposed on the other tine and extends intermediate electrode 16 on the first tine. The back surface includes electrodes 25 and 26 forming the same electrode configuration formed by electrodes 16 and 17 on the front surface. Electrodes 16 and 17 on the front surface are respectively coupled to terminals 22 and 23 by wires 20 and 21. Electrodes 25 and 26 are electrically coupled to metallic films 18 and 19 by electrode portions 27 and 28 thereon. In operation, when electrodes 16 and 17, and 25 and 26 have applied thereto positive and negative voltages, respectively, by an alternating current signal, the electric fields illustrated by the curved arrows in FIG. 8 are generated. As the generated stress has reverse directions at the inner and outer sides of the tines, a symmetrical flexural vibration is effected in the tuning fork vibrator.

Accordingly, the dynamic impedance of the quartz crystal vibrator is on the order of 50 kilo-ohms, considerably less than the vibrator depicted in FIG. 1. Moreover, the temperature range between 20° and 40° C can be selected in response to the angle $\gamma$ wherein the temperature coefficient of expansion is zero. Thus, a quartz crystal vibrator capable of providing good performance and being reduced to a small size for use as a high frequency time standard in a small sized electronic wristwatch is provided. Nevertheless, because two electrodes of opposite polarities must be coupled through leads from both the front and back surfaces, conventional mounting methods wherein the vibrator is mounted on the entire base portion will not be sufficient. Accordingly, an insulator 24 includes two spaced apart metallic films 18 and 19 for providing a contact terminal for the front and back electrodes to allow same to be coupled to pin terminals 22 and 23 by bonding wires 20 and 21.

Figure 9A:
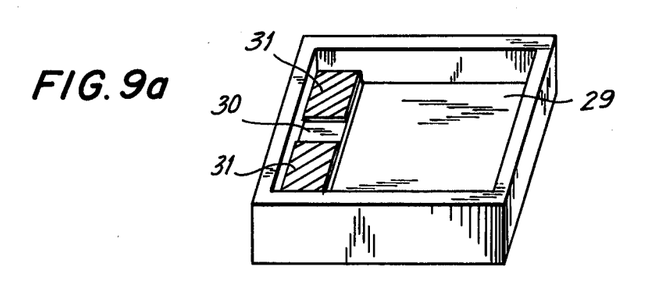
FIGS. 9a and 9b are perspective views of a mounting case for a tuning fork quartz crystal vibrator constructed in accordance with the instant invention.
Figure 9B:
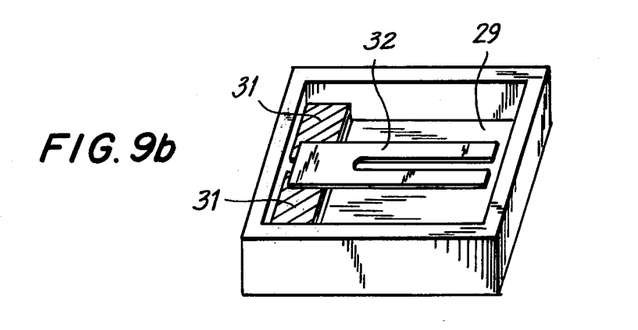
Figure 10A:
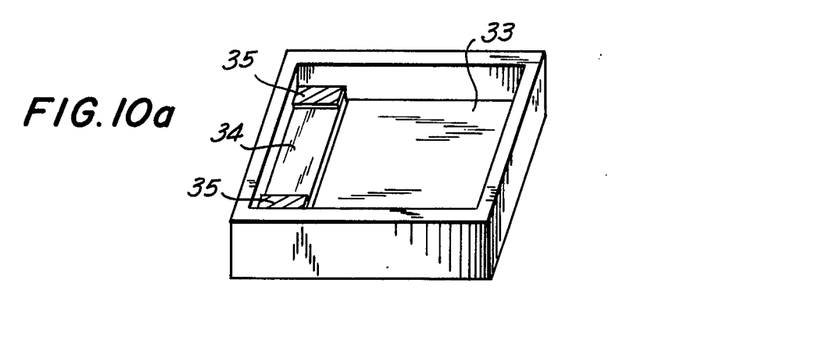
FIGS. 10a, 10b and 10c are perspective views of a mounting case constructed in accordance with a preferred embodiment of the instant invention.
Figure 10B:
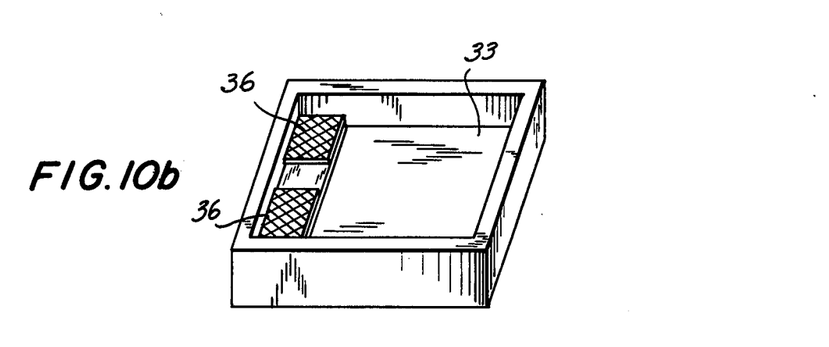
Figure 10C:
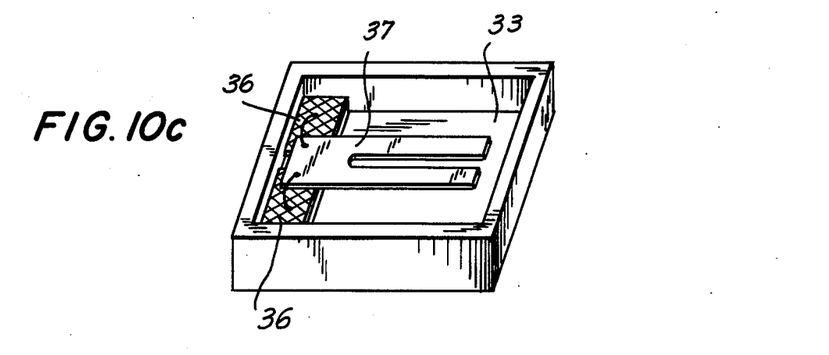
Figure 10D:
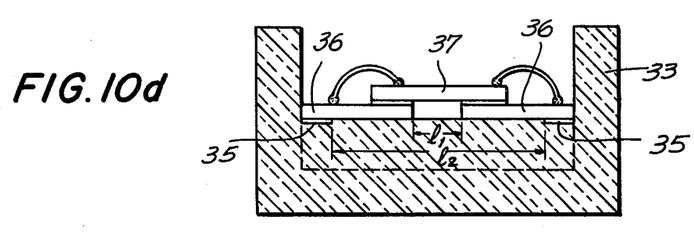
FIG. 10d is a sectional view of the quartz crystal vibrator mounting case depicted in FIG. 10c.

Such mountings are usually included in a case. Although quartz crystal vibrators have been formed in metallic cases, it has become advantageous to integrally form the mounting member and the case together in order to obtain a further reduction in the size of the entire vibrator assembly and further include an integrated driving circuit board in the same case. Accordingly, the use of ceramics to form such a case is desirable. As specifically depicted in FIGS. 9a and 9b, a quartz crystal vibrator assembly including a ceramic case 29 is illustrated. The ceramic case 29 includes a step 30, functioning as a mounting member for the quartz crystal vibrator 32. Metallic film elements 31 are deposited into two discrete and spaced apart portions by sintering. The metallic film is coupled to the outside of the case through conductors passed through the ceramic walls (not shown). Alumina ceramics have been utilized to form the case since such ceramics have thermal expansion coefficients of about $7 \times 10^{-6}$ in comparison to Z-plate quartz crystals having a thermal coefficient of expansion of about $13 \times 10^{-6}$. Because of the large difference in the coefficients of expansion, when the vibrator is cooled after same is soldered to the case, the quartz crystal vibrator tends to break due to the large tensile stress. Moreover, no ceramic material has yet been developed that has a high enough thermal coefficient of expansion to render same suitable for use with a quartz crystal vibrator having a thermal coefficient of expansion of about $13 \times 10^{-6}$.

Reference is now made to FIGS. 10a through 10d wherein a mounting case for a tuning fork quartz crystal vibrator constructed in accordance with the preferred embodiment of the instant invention is depicted. In 10a, a ceramic case having a step 34 for supporting spaced apart metallic films 35 is illustrated. A pair of spaced apart metallic plates 36 are adhered to the sintered films 35 by a brazing alloy or the like. Thereafter, a quartz crystal vibrator is secured to the metallic plates 36. As is specifically illustrated in FIG. 10d, the quartz crystal vibrator 37 spans the metallic plates 36, which plates are spaced apart by an interval $l_1$. Aditionally, an interval $l_2$ exists between the two sintered films upon which the metallic plates are secured. Because the metallic plates are secured to the sintered films, the remaining portions thereof remain free, and able to expand or contract. As is detailed below, breakage of the quartz crystal vibrator resulting from stresses caused by temperature changes are avoided by the instant invention. Assuming the variation in the interval between the two metallic plates and in the interval between films 35 prior to and after a temperature change $\Delta T$ to be equal, the following case exists:

$$l_2 \alpha C \Delta T - (l_2 - l_1) \alpha M \Delta T = l_1 \alpha Q \Delta T$$

Therefore $$(\alpha Q - \alpha M) l_1 = (\alpha C - \alpha M) l_2$$

wherein, $\alpha_C$ is a coefficient of linear expansion of the ceramic; $\alpha_Q$ is a coefficient of linear expansion of the quartz crystal vibrator; and $\alpha_M$ is a coefficient of linear expansion of the metallic plate. In order to simplify the explanation, temperature influences on the coefficients of linear expansion have been ignored. Accordingly, for the case where $\alpha_C$ equals $7 \times 10^{-6}$, $\alpha_Q = 13 \times 10^{-6}$, and $\alpha_M = 5 \times 10^{-6}$, then $l_1 : l_2$ equals $1:4$.

Although the above calculations are under ideal conditions, it is fair to assume that each respective metal expands in accordance with its thermal coefficient of expansion even at the portion which is secured to the metallic plates and quartz crystal vibrator. Nevertheless, under actual conditions, the actual expansion is even larger. Accordingly, in practice, the value of the interval $l_1$ should be taken as a bit larger than the actual interval. Because the area of the portion is reduced, distress caused by different expansion coefficients eliminates any disadvantages which might occur.

From the foregoing it is noted that when a ceramic mounting is provided with a quartz crystal vibrator having a larger thermal coefficient of expansion than that of the mounting, the difference in the expansion coefficients of the respective materials may be negated if two metallic plates formed from a substance having a smaller thermal coefficient expansion than that of the mounting or the crystal vibrator, such as Kovar, is inserted therebetween. The quartz crystal vibrator is rendered stable with respect to temperature changes, as if same were mounted to a mounting member having the same thermal coefficient of expansion as the mounting. It is noted that metallic plates 36 can be formed by depositing the conductive metal on an insulator having a desired thermal coefficient of expansion.

Figure 11A:
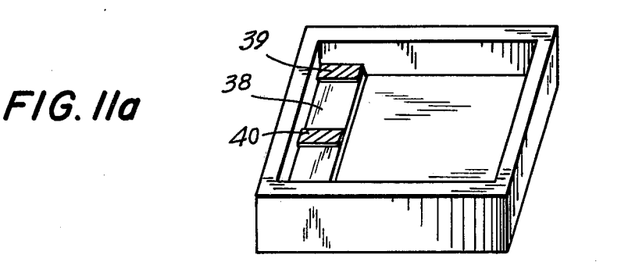
FIGS. 11a and 11b are perspective views of a quartz crystal vibrator mounting case constructed in accordance an alternate embodiment of the instant invention.
Figure 11B:
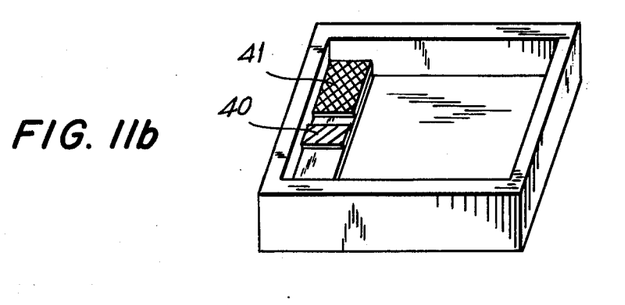
Figure 11C:
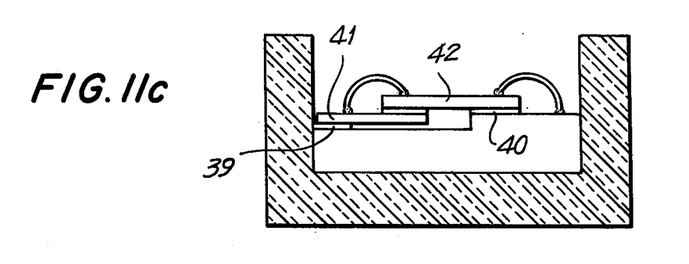
FIG. 11c is a sectional view of the quartz crystal vibrator mounting case depicted in FIG. 11b.

Reference is now made to FIGS. 11a, 11b and 11c wherein a ceramic case for supporting a quartz crystal vibrator in accordance with an alternate embodiment of the instant invention is depicted. Metal film portions 39 and 40 are disposed on a step 38 of a ceramic case. As specifically depicted in FIG. 11c, the metal film portion 40 is disposed at a higher elevation than the metal film 40. A metallic plate 41 is then mounted to the lower elevational metallic film 89, and a quartz crystal vibrator is then mounted to metallic film 40 and metallic plate 41. Accordingly, as long as the metallic plate 41 is of a thermal coefficient of expansion lower than the ceramic supporting member and the quartz crystal vibrator, the quartz crystal vibrator is rendered compatable for use with the ceramic case.

Figure 12A:
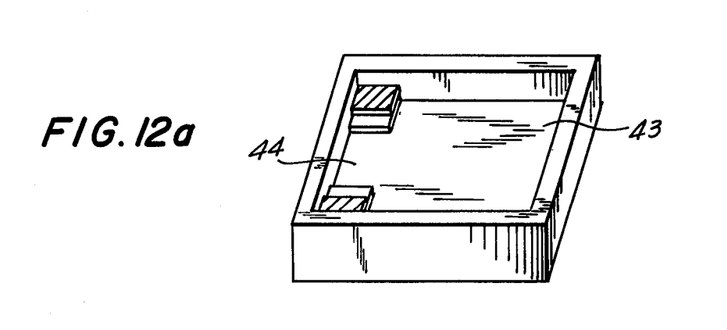
FIG. 12a through 12c are perspective views of a quartz crystal vibrator mounting case constructed in accordance with another alternate embodiment of the instant invention.
Figure 12B:
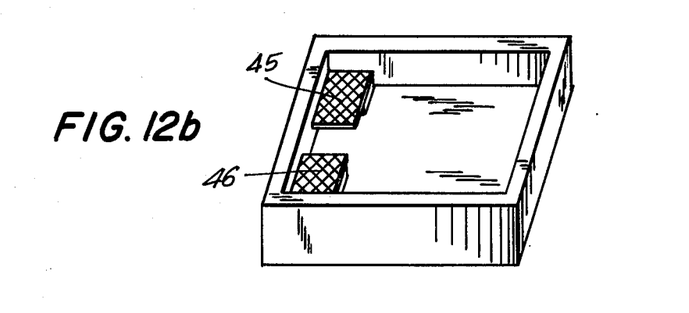
Figure 12C:
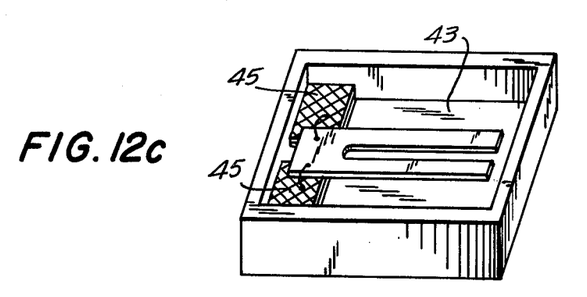

Reference is now made to FIGS. 12a, 12b and 12c wherein a mounting member in accordance with still another embodiment of the instant invention is provided. A central portion 44 of the step in the ceramic case 43 is removed to define two steps. The metallic film is then deposited on the steps, and the metallic plates are secured to the film so that same overhang toward the center. Thereafter, the vibrator is mounted so as to span the two metallic plates. In accordance with this embodiment, the resilient plates provide a shock-absorbent embodiment in addition to the elimination of the stress caused by the differences in the thermal coefficient of expansion between the quartz crystal vibrator and the case.

Figure 13:
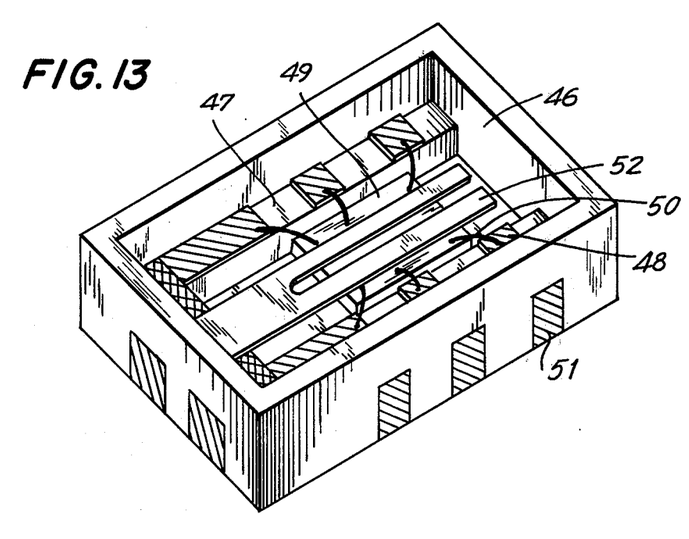
FIG. 13 is a perspective view of a quartz crystal vibrator mounting case constructed in accordance with still another alternate embodiment of the instant invention.

Finally, reference is made to FIG. 13 wherein a perspective view of still a further embodiment of the instant invention wherein the advantages which inure thereto are maximized. A ceramic case 46 is provided with steps 47. Portions of the step include a metal film deposited thereon. An integrated circuit chip 49 is coupled to the metallized portions by bonding wires 50, which wires are further led out to the metallized portions 51 on the outer periphery of the case. Quartz crystal vibrator 52 is then adhesively secured in the same manner as the earlier embodiments. Accordingly, the quartz crystal vibrator and the integrated circuit chip for driving same are assembled in a precisioned compact body for utilizing the instant invention. Moreover, the ceramic case is shock resistant and provides improved electrical contacts for use in a small sized electronic timepiece.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A mounting for supporting a flexural mode quartz crystal vibrator having two opposed surfaces with two electrodes disposed on at least one of the opposed surfaces comprising a non-conductive member having first and second conductive surfaces, spaced apart by an interval $l_2$, the non-conductive member having a lesser thermal coefficient of expansion than the quartz crystal vibrator, and a conductive plate secured to said first conductive surface of said quartz crystal vibrator for physically and electrically coupling said first electrode to said first conductive surface, said conductive plate having a thermal coefficient of expansion less than the non-conductive member, and conductive means constructed and arranged to secure, rigidly fix and electrically couple said second spaced apart conductive surface to said second electrode, said conductive means being spaced apart from said first conductive plate by an interval $l_1$, wherein the ratio of $l_1$ to $l_2$ is less than one and is substantially equal to the ratio of the differences between the respective thermal coefficients of expansion of the non-conductive member and the conductive plate to the difference between the respective thermal coefficients of expansion of the quartz crystal vibrator and the conductive plate.

2. A mounting for supporting a flexural mode quartz crystal vibrator as claimed in claim 1 wherein said conductive means is a second conductive plate disposed between said second conductive surface and said second electrode of said quartz crystal vibrator for physically mounting said vibrator and electrically coupling said second electrode to said second conductive surface, said second conductive plate also having a lesser thermal coefficient of expansion than said quartz crystal vibrator and non-conductive member, and being spaced apart from said first conductive plate by said interval $l_1$.

3. A mounting for supporting a flexural mode quartz crystal vibrator as claimed in claim 2, wherein said first and second electrodes on said first opposed surfaces of said quartz crystal vibrator are disposed to allow the vibrator to span said spaced apart conductive plates.

4. A mounting for supporting a flexural mode quartz crystal vibrator as claimed in claim 1, wherein said non-conductive member is ceramic.

5. A mounting for supporting a flexural mode quartz crystal vibrator as claimed in claim 2, wherein said non-conductive member defines a case for supporting said quartz crystal vibrator therein, said case including an integrally formed step, said step having disposed thereon two spaced apart metallic films, said metallic films defining said respective first and second conductive surfaces.

6. A mounting for supporting a flexural mode quartz crystal vibrator as claimed in claim 5, wherein said metallic films are sintered to said step, and said conductive plates include at least a metallic surface for providing an electrically conductive element.

7. A mounting for supporting a flexural mode quartz crystal vibrator as claimed in claim 6, wherein said quartz crystal vibrator is a tuning fork vibrator, said vibrator spanning said spaced apart conductive plates.

8. A mounting for supporting a flexural mode quartz crystal vibrator as claimed in claim 1, wherein said mounting member defines a case for supporting said quartz crystal vibrator therein, said case including a first step and second step, said respective first and second spaced apart conductive surfaces being respectively disposed on said first and second steps.

9. A mounting for supporting a flexural mode quartz crystal vibrator as claimed in claim 8, wherein said conductive means includes a second conductive plate disposed between said second conductive surface and said second electrode for physically mounting said vibrator and electrically coupling said second electrode on the opposed surface to said second conductive surface, said second conductive plate also having a lesser thermal coefficient of expansion than said quartz crystal vibrator and non-conductive member, and being spaced apart from said first conductive plate by said interval $l_1$.

10. A mounting for supporting a flexural mode quartz crystal vibrator as claimed in claim 8, wherein said first step is higher than said second step, said conductive plate being disposed on said second step conductive surface.

11. A mounting for supporting a flexural mode quartz crystal vibrator as claimed in claim 9, wherein said first and second steps are spaced apart by a larger interval than said conductive plates, said plates thereby overhanging said steps in the interval between same, said quartz crystal vibrator being secured to the overhanging portion of said plates to bridge the interval between same.

12. A mounting for supporting a flexural mode quartz crystal vibrator as claimed in claim 4, and including an integrated circuit chip supported by said ceramic member, and at least two conductors coupling said respective first and second conductive surfaces to said integrated circuit chip.

* * * * *